US008809680B2

(12) United States Patent
Kiely

(10) Patent No.: US 8,809,680 B2
(45) Date of Patent: Aug. 19, 2014

(54) GROUNDING BRIDGE

(75) Inventor: Kenneth M. Kiely, Milford, CT (US)

(73) Assignee: Bridgeport Fittings, Inc., Stratford, CT (US)

( * ) Notice: Subject to any disclaimer, the term of this patent is extended or adjusted under 35 U.S.C. 154(b) by 627 days.

(21) Appl. No.: 12/798,181

(22) Filed: Mar. 31, 2010

(65) Prior Publication Data

US 2011/0240328 A1 Oct. 6, 2011

(51) Int. Cl.

| | |
|---|---|
| ***H05K 5/02*** | (2006.01) |
| ***H01R 4/66*** | (2006.01) |
| ***H01R 13/648*** | (2006.01) |
| ***H01R 11/09*** | (2006.01) |
| ***H01R 4/36*** | (2006.01) |
| ***H01R 4/64*** | (2006.01) |
| ***H01R 4/34*** | (2006.01) |

(52) U.S. Cl.

CPC ... *H01R 4/64* (2013.01); *H01R 4/34* (2013.01)
USPC .............. 174/51; 439/100; 439/797; 439/810

(58) Field of Classification Search

CPC .............. H01R 4/64; H01R 4/36; H01R 4/28; H01R 4/30; H01R 4/301; H01R 4/302; H01R 4/305; H01R 4/307; H01R 4/308; H01R 4/32; H01R 4/363; H01R 4/38; H01R 4/58; H01R 4/60; H01R 4/643; H01R 4/646; H01R 9/223; H01R 11/05; H01R 11/09; H01R 11/12
USPC ....... 174/51, 40 CC; 439/797, 798, 108, 810, 439/812, 814, 92, 100, 801; 285/404
See application file for complete search history.

(56) References Cited

U.S. PATENT DOCUMENTS

| | | | | |
|---|---|---|---|---|
| 1,677,628 A * | 7/1928 | Gould | ........................ | 285/154.3 |
| 1,885,227 A * | 11/1932 | Buchanan | ........................ | 174/51 |
| 2,052,394 A * | 8/1936 | Fullman | ........................ | 285/404 |
| 2,117,112 A | 5/1938 | Buchanan | | |
| 2,164,021 A | 6/1939 | Rogoff | | |
| 2,232,602 A | 2/1941 | Grace | | |
| 2,308,528 A | 1/1943 | Luecke | | |

(Continued)

OTHER PUBLICATIONS

Erico International Corporation; Brochure entitled: "Intersystem Bonding Termination for Residential and Small Commercial Facilities"; 2009; whole document.

(Continued)

*Primary Examiner* — Chau N Nguyen
*Assistant Examiner* — Roshn Varghese
(74) *Attorney, Agent, or Firm* — Ware, Fressola, Maguire & Barber LLP

(57) ABSTRACT

By providing a single housing, component or element incorporating a plurality of passageways or receiving zones formed therein in cooperating association with a mounting ring or clamp constructed for being quickly and easily secured to a clamp, conductor or conduit mounted to an electrical box, junction box, meter box, or similar enclosure, an efficient, easily manufactured and easily assembled bonding bar or grounding bridge is achieved. Preferably, the plurality of passageways/receiving zones are constructed with each passageway or receiving zone cooperatively associated with a locking screw or set screw configured to enable grounding conductors to be inserted through the passageway/receiving zone and securely mounted therein. In this way, grounding conductors from telephones, cable televisions, satellite receivers, radios, television antennas, and the like may be inserted into the passageways/receiving zones and securely mounted in the desired position.

5 Claims, 2 Drawing Sheets

(56) References Cited

U.S. PATENT DOCUMENTS

| | | | | | |
|---|---|---|---|---|---|
| 2,579,139 | A | * | 12/1951 | Chipley | 174/7 |
| 2,748,365 | A | | 5/1956 | Speck | |
| 2,782,393 | A | | 2/1957 | Vordtriede | |
| 3,133,779 | A | * | 5/1964 | Stanback | 439/798 |
| 3,492,625 | A | * | 1/1970 | Bromberg | 174/51 |
| 3,794,963 | A | | 2/1974 | Cooper, Jr. | |
| 4,526,437 | A | | 7/1985 | Kies | |
| 4,708,418 | A | * | 11/1987 | Reyna | 439/804 |
| 4,776,808 | A | * | 10/1988 | Davidson | 439/814 |
| 5,036,164 | A | * | 7/1991 | Schrader et al. | 174/94 R |
| 5,342,998 | A | * | 8/1994 | Nolte et al. | 174/152 R |
| 5,494,462 | A | | 2/1996 | Auclair | |
| 5,929,383 | A | * | 7/1999 | Marik et al. | 174/78 |
| 5,931,708 | A | | 8/1999 | Annas et al. | |
| 6,664,469 | B1 | * | 12/2003 | Sweeney | 174/51 |
| 6,669,511 | B1 | * | 12/2003 | Yagi et al. | 439/98 |
| D536,229 | S | | 2/2007 | Clark et al. | |
| 7,537,467 | B1 | * | 5/2009 | Gretz | 439/798 |
| 7,537,494 | B1 | * | 5/2009 | Umlauf | 439/798 |
| 7,637,754 | B1 | * | 12/2009 | Yerena et al. | 439/108 |
| 7,963,811 | B2 | * | 6/2011 | Wason et al. | 439/798 |
| 2010/0203775 | A1 | * | 8/2010 | Howard et al. | 439/801 |
| 2011/0237140 | A1 | * | 9/2011 | Cerasale | 439/797 |

OTHER PUBLICATIONS

Arlington Industries, Inc.; Advertisement for a Grounding Bridge in publication entitled "Electrical Contractor Magazine"; Aug. 2009; p. 125.

* cited by examiner

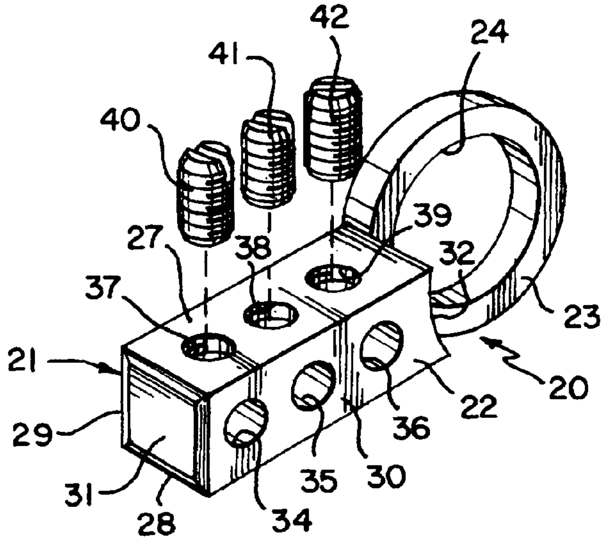
FIG. 1
FIG. 2A
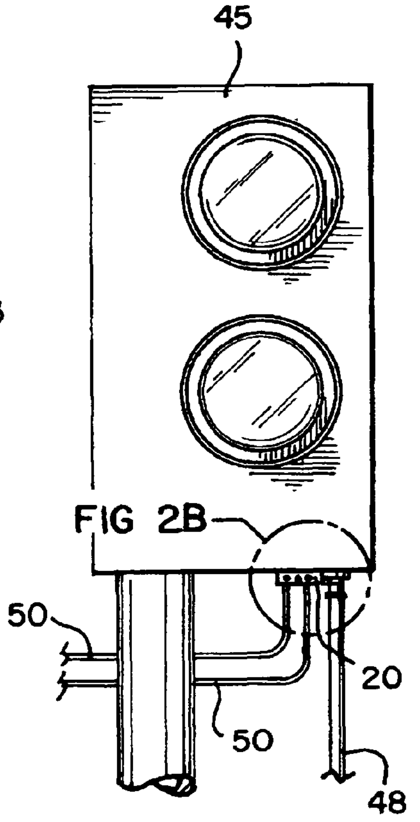
FIG. 2B
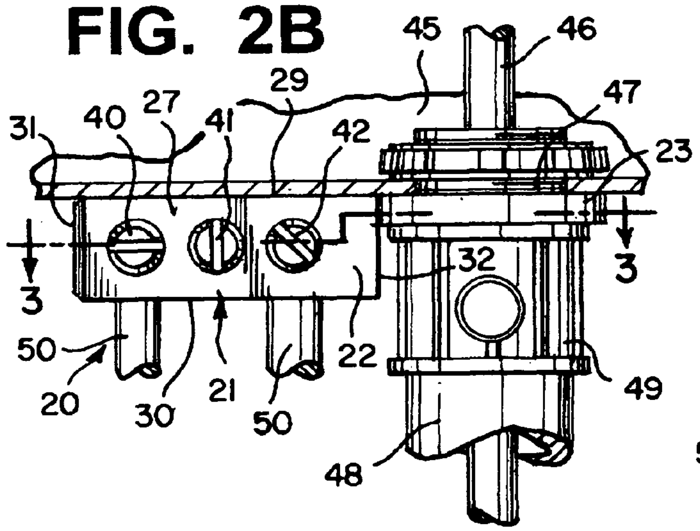
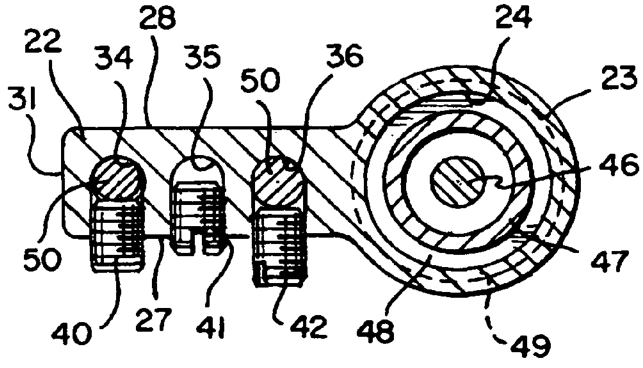
FIG. 3

GROUNDING BRIDGE

TECHNICAL FIELD

This invention relates to electrical connectors, and more particularly, to electrical clamps or connectors constructed for bonding and grounding communication systems.

BACKGROUND OF THE INVENTION

In the field of wiring homes and buildings, whether for new construction or for improvements or expansion, substantial development and product improvements have been made. Typically, these improvements are directed to enabling installers to securely and safely mount any desired wiring to any desired location in the most efficient and quickest manner.

In any particular installation or location, various conduits or cables must be interconnected to each other as well as connected to the primary power supply in a suitable power distributing outlet box, junction box, meter box, or other enclosure. In these instances, flexible metal conduit and/or armor or metalclad cables within which the electrical power carrying wires are contained, must be securely mounted to the housing of a junction box or outlet box, or connected to an appropriate solid or rigid metal tubing or conduit.

In addition, in order to assure that the installed conduits or cables and the electrical power carrying wires contained therein are properly and safely installed for operation, power distributing outlet boxes, junction boxes, meter boxes, and other similar enclosures typically incorporate grounding electrode conductors which are interconnected to the power supply and extend from the particular box to a properly installed grounding rod or remote grounded location. In this way, all of the power carrying wires installed in the particular home or building are properly connected to a grounded location.

In 2008, various Articles of the National Electric Code (NEC) were rewritten to define new requirements for Intersystem Bonding Termination. In this regard, requirements for installing a bonding connection point for communication systems were specifically defined. Due to the numerous instances in which homes, electrical systems, electronic equipment, communication equipment, and the like were destroyed or severely damaged by uncontrolled events such as lightning, power surges, etc., the new requirements were established to provide an effective and reliable intersystem bonding termination which should reduce or eliminate the difficulties and damage that has been encountered.

In accordance with the new requirements, the intersystem bonding termination establishes a device which provides a connecting point for communication grounding and bonding systems to the electrical service equipment. In achieving this goal, the intersystem bonding terminations must employ either (1) a set of terminals mounted and electrically connected to the meter enclosure, (2) a bonding bar near the service or meter equipment and closure or close to the raceway for the service conductors, or (3) the installation of a bonding bar near the grounding electrode conductor.

Although these requirements have been in existence for several years, commercially available products which are capable of achieving the desired mounted connections are both limited and expensive. Typically, these prior art products incorporate components which are expensive to manufacture due to tolerance requirements for enabling these components to be secured to the desired grounding rod/grounding electrode conductor. Consequently, a need exists in the industry for the production of effective products, such as bonding bars or grounding bridges, which are capable of being employed to satisfy the requirements for the intersystem bonding termination and are capable of being manufactured inexpensively, while also providing a high quality, highly effective and easily employed product.

Therefore, it is a principal object of the present invention to provide a bonding bar or grounding bridge which is capable of being easily installed in any desired location for being secured to a meter enclosure, meter equipment, or grounding electrode conductor.

Another object of the present invention is to provide a bonding bar/grounding bridge having the characteristic features described above which is manufactured from easily produced components, thereby achieving a safe, effective, and cost efficient product.

Another object of the present invention is to provide a bonding bar/grounding bridge having the characteristic features described above which virtually eliminates complicated installation techniques and achieves an easily installed product which is capable of being used by individuals having widely varied experiences.

Another object of the present invention is to provide a bonding bar/grounding bridge having the characteristic features described above which enables the entire assembly and mounted engagement to be achieved quickly and easily by a single individual.

Other and more specific objects will in part be obvious and well in part appear hereinafter.

SUMMARY OF THE INVENTION

By employing the present invention, all of the difficulties and drawbacks of prior art systems have been eliminated and an efficient, easily manufactured and easily assembled bonding bar or grounding bridge is achieved. In accordance with the present invention, a single housing, component or element is constructed incorporating a plurality of passageways or receiving zones formed therein, with each passageway or receiving zone cooperatively associated with a locking screw or set screw configured to enable grounding conductors to be inserted through the passageway/receiving zone and securely mounted therein. In addition, the plurality of passageways/receiving zones are mounted in cooperating association with a mounting ring or clamp constructed for being quickly and easily secured to a clamp, conductor or conduit mounted to an electrical box, junction box, meter box, or similar enclosure.

Typically, grounding conductors from telephones, cable televisions, satellite receivers, radios, television antennas, and the like are inserted into the passageways/receiving zones and securely mounted in the desired position. In addition, the mounting ring or clamp is constructed to peripherally surround or engage the clamp, conductor, or conduit affixed to or extending from an associated meter box, junction box, electrical outlet box or the like.

In this way, all of the requirements for a highly effective intersystem bonding termination are realized and all of the newly enacted code provisions are satisfied. Furthermore, the present invention achieves a combination grounding rod bridge assembly which effectively provides the desired bonding of the electrical system in a building or house with the grounding conductors from telephones, cable television, satellite receivers, radios, television antennas, satellite dishes, and the like.

In the preferred construction, the grounding bar bridge of the present invention is constructed as a separate and independent housing or element which is affixed to the desired meter box, junction box, electrical outlet box and the like, while also incorporating a plurality of separate and independent passageways or receiving zones formed therein, with each passageway or receiving zone incorporating a separate set screw or locking screw threadedly mounted to the housing. In this regard, each locking screw or set screw is positioned for enabling a grounding conductor to be telescopically inserted into a passageway/receiving zone, with the set screw, locking screw being quickly and easily threadedly advanced for contacting and securing the grounding conductor to the grounding bar/grounding bridge assembly.

Although the grounding bar/grounding bridge assembly of the present invention may incorporate any desired number of passageways or receiving zones for enabling a wide variety of various communication systems to be mounted therewith, typically, the combination grounding rod bridge assembly incorporates between about four and six passageways or receiving zones. In this way, conventional installations of various communication systems can be easily accommodated in their entirety.

In addition, in the preferred construction, the combination grounding rod bridge assembly of the present invention is constructed from conductive material in order to assure that the desired grounded and bonding connection is realized and an intersystem bonding termination is achieved.

The invention accordingly comprises an article of manufacture possessing the features, properties, and the relation of elements which will be exemplified in the article hereinafter described, and the scope of the invention will be indicated in the claims.

THE DRAWINGS

For a fuller understanding of the present invention, reference should be had to the following detailed description taken in connection with the accompanying drawings, in which:

FIG. 1 is an exploded perspective view of the grounding bridge assembly of the present invention;

FIG. 2A is a front elevation view of a typical installation of the grounding bridge assembly of the present invention when mounted to a meter box;

FIG. 2B is a side elevation view of the grounding bridge assembly of the present invention as mounted to the meter box in FIG. 2A, with the portion thereof designated 2B being greatly enlarged;

FIG. 3 is a cross-sectional, top plan view of the grounding bridge assembly of the present invention taken along line 3-3 of FIG. 2B;

DETAILED DISCLOSURE

Figure 4:
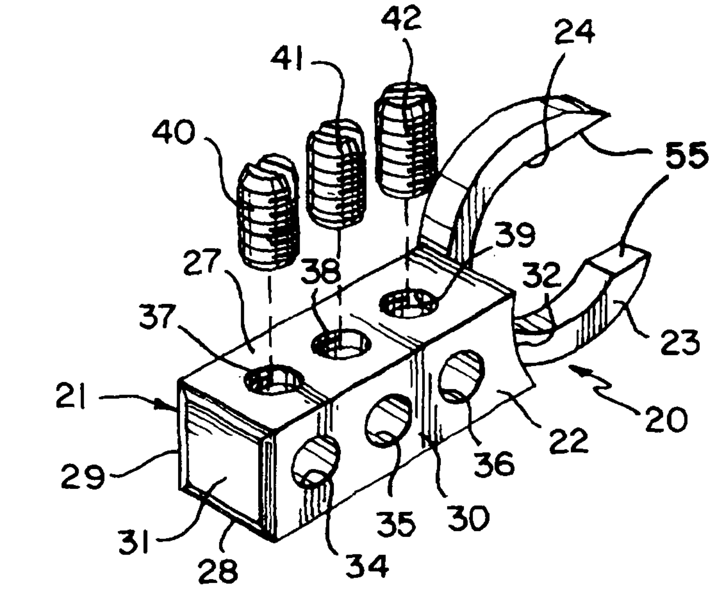
FIG. 4 is an exploded perspective view of an alternate embodiment of the grounding bridge assembly of the present invention.

By referring to FIGS. 1-6, along with the following detailed discussion, the construction, operation, and installation of the grounding bridge assembly of the present invention can best be understood. In addition, in this disclosure, two alternate embodiments of the present invention are fully shown and described. However, further alternate embodiments of the present invention can be implemented without departing from the scope of this invention. Consequently, it should be understood that the following detailed description, as well as the drawings associated herewith, are provided for exemplary purposes and are not intended as a limitation of the present invention.

By referring to FIGS. 1-3, along with the following detailed discussion, the construction of one preferred embodiment of grounding bridge assembly 20 of the present invention can best be understood. As depicted, in this embodiment, grounding bridge assembly 20 comprises housing member 21 which incorporates generally rectangular shaped portion 22 and mounting portion 23 which is integrally affixed to rectangular portion 22. In the preferred construction of this embodiment, mounting portion 23 comprises a circular shaped annular ring incorporating an enlarged, central, circular shaped cavity 24 form therein.

In the preferred construction, circular shaped mounting portion 23 is mounted to one terminating edge of rectangular shaped portion 22 for being integrally affixed thereto. Although any desired mounting method or configuration can be employed, secure, integral affixation is preferred.

As depicted, in this embodiment, rectangular shaped portion 22 comprises front surface 27, rear surface 28, top surface 29, bottom surface 30 and side surfaces 31 and 32. In addition, rectangular shape portion 22 also comprises circular shaped passageways or channels 34, 35, and 36 formed therein adjacent to each other. In the preferred construction, each passageway 34, 35, and 36 is formed in top surface 29 and extends through rectangular shape portion 22, terminating with bottom surface 30.

In addition, rectangular shaped portion 22 of grounding bridge assembly 20 also incorporates a plurality of screw receiving cavities form therein, with each screw receiving cavity being associated with one passageway or channel. As depicted, screw receiving cavity 37 is formed in front surface 27 of rectangular shape portion 22 in association with passageways/channel 34. In this regard, screw receiving cavity 37 extends into rectangular shaped portion 22 from front surface 27, terminating in mating communication with passageways/channel 34.

Furthermore, screw receiving cavity 37 comprises a threaded surface formed thereon, thereby enabling cooperating set screw 40 to be inserted therein for threaded engagement therewith. Once set screw 40 has been threadedly engaged in cavity 37, any desired grounding wire or conductor can be easily inserted into passageway/channel 34 and secured in position by advancing set screw 40 into cavity 37 until secure engagement of the grounding wire/conductor is achieved. Whenever grounding wire/conductor is mounted in this position, and secured in place, the desired assembly is achieved.

Using virtually identical constructions, threaded cavity 38 is formed in rectangular shaped portion 22 communicating with passageways/channel 35. In addition, set screw 41 is employed for being threadedly engaged with cavity 38 for securing an additional grounding wire/conductor in the desired position.

Similarly, threaded cavity 39 is formed in rectangular shape portion 22 in communication with channel/passageway 36. In addition, set screw 42 is threadedly mounted in cavity 39 for securing any desired additional grounding wire conductors in channel/passageway 36.

As is evident from the foregoing detailed disclosure, this embodiment of grounding bridge assembly 20 provides three separate and independent connection points for enabling grounding wire/conductors of various communication systems to be securely mounted to grounding bridge assembly 20 to achieve the desired intersystem bonding termination for these components. Furthermore, combination grounding bridge assembly 20 may be constructed with any desired number of connection points for enabling grounding wire/conductors to be secured thereto. In this way, an intersystem bonding termination can be achieved for all of the communication systems installed in a particular location.

As discussed above, this embodiment of the present invention comprises mounting portion 23 constructed as an annular ring for enabling grounding bridge assembly 20 to be quickly and easily installed in any desired location in direct association with a meter box, junction box, electrical outlet box, or other electrical enclosure. In this regard, FIGS. 2A and 2B depict grounding bridge assembly 20 securely mounted in position in association with meter box 45.

In a typical installation of a meter box, junction box, electrical outlet box, or other electrical enclosure, service grounding conductor 46 is employed to assure that all of the electrical components, connections, and the like, contained in the particular box are all properly grounded. As a result, service grounding conductor 46 extends from a common interconnection point in the interior of the box, through a knockout plug or hole formed in the box, and terminates with a code acceptable ground connection. In addition, in order to assure the proper handling and grounding of all components, service grounding conductor 46 is mounted to clamp or connector 47 which is typically secured in the knockout plug of box 45 to achieve the desired secure installation.

In addition, in many installations, service grounding conductor 46 is positioned in a metallic or nonmetallic fitting, conduit or raceway. In order to obtain this installation quickly and easily, service grounding conductor 46 is affixed to clamp/connector 47, with clamp/connector 47 being advanced through the knockout hole formed iri box 45 and secured in place. In addition, clamp/connector 47 is constructed for being cooperatively associated with raceway 48 which is constructed for peripherally surrounding and housing the elongated length of service grounding conductor 46 which extends outside of box 45. Furthermore, in order to assure the secure interengagement of raceway 48 with box 45 and clamp/connector 47, coupling 49 is employed.

In most installations, coupling 49 is threadedly engaged with a portion of clamp/connector 47 which extends outwardly from box 45. By threadedly engaging these components together, the secure mounted connection of raceway 48 with clamp/connector 47 is achieved. In accordance with the present invention, grounding bridge assembly 20 is quickly and easily installed in position by mounting grounding bridge assembly 20 to clamp/connector 47 prior to the engagement of coupling 49 therewith.

As best seen in FIG. 2B, ring shaped mounting portion 23 of grounding bridge assembly 20 is placed peripherally surrounding the end of clamp/connector 47 exiting from box 45 prior to the threaded engagement of coupling 49 therewith. Once the grounding bridge assembly 20 is secured in the desired position, coupling 49 is securely mounted to clamp/connector 47 with grounding bridge assembly 20 sandwiched between coupling 49 and box 45. In this way, the secure grounded affixation of grounding bridge assembly 20 in the precisely desired position is achieved quickly and easily.

In addition, in order to provide the desired intersystem bonding termination, grounding conductor 50 from each of the desired services selected from the group consisting of telephones, cable television, satellite receivers, radios, television antennas, satellite dishes, and the like, is inserted into passageways/channels 34, 35, and 36 and secured in position by employing set screws 40, 41, and 42. Once each of the desired grounding conductors 50 are secured in place, the installation is complete and the desired intersystem bonding termination is achieved.

Figure 5:
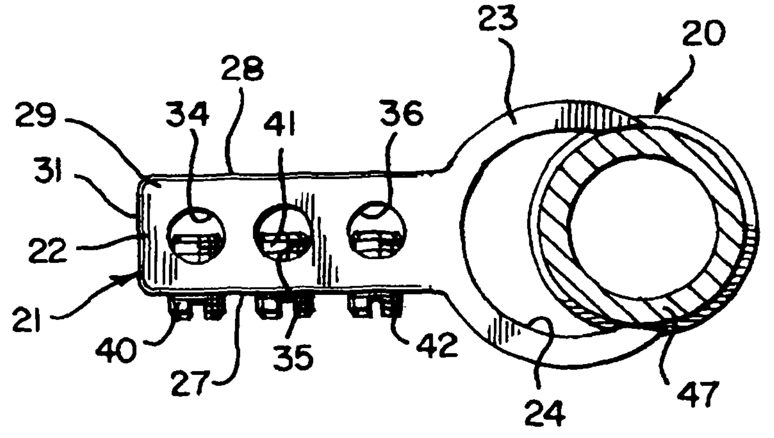
FIG. 5 is a top plan view of the grounding bridge assembly of FIG. 4 in the process of being installed.
Figure 6:
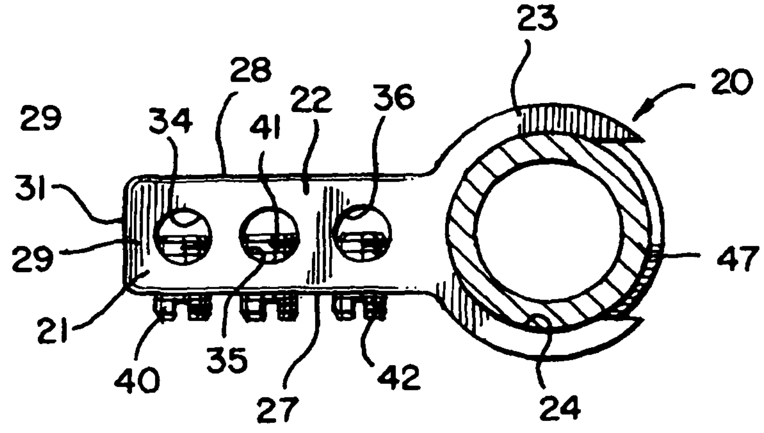
FIG. 6 is a top plan view of the grounding bridge assembly of FIG. 4 when fully installed.

By referring to FIGS. 4-6, an alternate embodiment for grounding bridge assembly 20 is a fully depicted. By referring to these figures, along with the following detailed discussion, the construction and operation of this alternate embodiment can be fully understood. In this embodiment, an alternate configuration is provided, which still achieves all of the goals, objectives, and installation ease detailed above.

As is evident from FIGS. 4-6, in this alternate embodiment, grounding bridge assembly 20 comprises a construction which is substantially identical to the construction detailed above and shown in FIGS. 1-3, except for the construction and configuration of mounting portion 23. As a result, the substantially identical components depicted in FIGS. 4-6 employ identical reference numerals which refer to substantially identical components or elements. In this way, unnecessary repetition is avoided, along with the understanding that the disclosure provided above regarding these virtually identical components or elements is hereby repeated by reference.

In this embodiment, grounding bridge assembly 20 comprises housing member 21 which incorporates rectangular shaped portion 22 and mounting portion 23. In this embodiment, rectangular shaped portion 22 is constructed in a manner virtually identical to rectangular shaped portion 22 of the previous embodiment. As a result, all of the details of construction provided above, particularly all discussion regarding channels/passageways 34, 35, 36, screw receiving cavities 37, 38, and 39 and set screws 40, 41, and 42 are all depicted in FIGS. 4-6 with the detailed disclosure and discussion regarding these components being identical to the foregoing detailed discussion which is repeated herein by reference.

As mentioned above, the principal variation between this embodiment and the previous embodiment is the construction of mounting portion 23. In this regard, mounting portion 23 comprises a C-shaped configuration which is securely affixed to side edge of 32 of rectangular shaped portion 23. In addition, C-shaped mounting portion 23 is constructed with entry zone 55 of C-shaped portion 23 positioned on the opposed side of mounting portion 23 which is affixed to rectangular shaped portion 22. In this way, grounding bridge assembly 20 is quickly and easily positioned in the desired location and secured in place.

As discussed above, grounding bridge assembly 20 is quickly and easily mounted to meter box 45 in direct association with the service grounding conductor of the box, as well as the clamp connectors, raceways and couplings associated therewith. As discussed above with the embodiment shown in FIGS. 1-3, the previous embodiment of grounding bridge assembly 20 must be cooperatively associated with box 45 and the components thereof during the installation of the raceway and the coupling. However, by employing the embodiment of grounding bridge assembly 20 depicted in FIGS. 4-6, this embodiment can be quickly and easily affixed to box 45 subsequent to the installation of these components and their connection to box 45.

In this regard, since mounting portion 23 incorporates an open ended, C-shaped configuration, mounting portion 23 can be quickly and easily secured to box 45 subsequent to the installation of the cooperating components by merely partially disconnecting the coupling 49 from clamp/connector 47 and slidingly advancing mounting portion 23 into engagement therewith as depicted in FIG. 5. Once the desired position is achieved, as depicted in FIG. 6, the components are secured to each other, as previously achieved, with grounding bridge assembly 20 also securely affixed therewith.

Once grounding bridge assembly 20 is secure in the desired position, the grounding conductors from the selected services are positioned in passageways/channels 34, 35, and 36 and secured in position by advancing set screws 40, 41, and 42 and threaded apertures 37, 38 and 39. Once the grounding conductors are secured in the desired position, the installation is complete.

As is evident from the foregoing detailed discussion of the two preferred embodiments of the present invention, the construction of grounding bridge assembly 20 enables any desired grounding conductors from various communication systems to be quickly and easily installed in a manner which achieves all of the requirements for providing a highly effective intersystem bonding between power and communication grounding systems. In this way, all of the requirements for an intersystem bonding termination are achieved.

It will thus be seen that the objects set forth above, among those made apparent from the preceding description, are efficiently attained and since certain changes may be made in the above article without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having describe my invention, what I claim as new and desired to secure by Letters Patent is:

1. A grounding bridge assembly constructed for being mounted to a meter box, junction box, electrical outlet box, or other electrical enclosure having a knockout hole formed therein, in combination with an electrical grounding conductor, said grounding bridge assembly comprising:

a housing member comprising a compact configuration formed from electrically conductive material, the housing member having a rectangular shaped portion with a front surface, a rear surface, a top surface, a bottom surface and a two side surfaces, the rectangular shaped portion having a plurality of passageways/channels formed therein through said top surface and said bottom surface with each passageway/channel being constructed for receiving and holding a grounding wire/conductor of a communication system component, a plurality of screw receiving cavities formed therein through said front surface, with each cavity being in cooperating association with one of said passageways/channels and constructed for receiving a threaded set screw for enabling said set screw to be advanced into securing engagement with a grounding wire/conductor inserted in said passageway/channel;

a mounting portion integrally mounted to one of the side surfaces of the rectangular shaped portion in a plane co-extensive with the plane of the top surface of the rectangular shaped portion, the mounting portion constructed as an annular ring, a clamp/connector configured to pass through the knockout hole of the meter box, junction box, electrical outlet box, or other electrical enclosure, the clamp/connector secured thereto and to said electrical grounding conductor, clamp/connector extending out of the knockout hole in a region to which the annular ring of the mounting portion of the grounding bridge assembly mechanically and electrically connects to said clamp/connector, the clamp/connector having a portion dimensioned for threaded engagement with a coupling so as to sandwich said annular ring of the mounting portion between the meter box, junction box, electrical outlet box, or other electrical enclosure and said coupling so as to enable said grounding bridge assembly to be securely mechanically and electrically affixed to the electrical enclosure in combination with the plurality of grounding wires/conductors associated with various communication system components.

2. The grounding bridge assembly defined in claim 1, wherein each of the plurality of passageways/channels is further defined as extending through the rectangular shaped portion of the housing member from a front surface to a rear surface thereof.

3. The grounding bridge assembly defined in claim 2, wherein each of the plurality of passageways/channels is further defined as comprising a generally circular shaped cross-section.

4. The grounding bridge assembly defined in claim 2, wherein each of the plurality of passageways/channels is further defined as being positioned in the rectangular shaped portion of the housing member in a generally continuous, side to side, co-axial array.

5. The grounding bridge assembly defined in claim 1, wherein each communication system is further defined as comprising one or more selected from the group consisting of telephones, cable televisions, satellite receivers, radios, television antennas, and satellite dishes.

* * * * *